US006841291B2

(12) United States Patent
Minamiura

(10) Patent No.: US 6,841,291 B2
(45) Date of Patent: Jan. 11, 2005

(54) METHOD AND APPARATUS FOR DETECTING ABNORMALITY IN BATTERY PACK SYSTEM

(75) Inventor: Keiichi Minamiura, Toyohashi (JP)

(73) Assignee: Panasonic EV Energy Co., Ltd., Shizuoka (JP)

(*) Notice: Subject to any disclaimer, the term of this patent is extended or adjusted under 35 U.S.C. 154(b) by 202 days.

(21) Appl. No.: 10/285,593

(22) Filed: Nov. 1, 2002

(65) Prior Publication Data

US 2003/0087147 A1 May 8, 2003

(30) Foreign Application Priority Data

Nov. 6, 2001 (JP) ........................................ 2001-340661

(51) Int. Cl.[7] ........................ H01M 2/00; H01M 10/48; H01M 2/10

(52) U.S. Cl. .............................. 429/61; 429/90; 429/99

(58) Field of Search ........................ 429/61–62, 90–92, 429/96–100; 320/134

(56) References Cited

U.S. PATENT DOCUMENTS

| 6,072,300 A | 6/2000 | Tsuji ........................... 320/116 |
| 6,278,257 B1 | 8/2001 | Takada et al. .............. 320/116 |

FOREIGN PATENT DOCUMENTS

| EP | 1085592 | 3/2001 |
| JP | 5236662 | 9/2001 |
| WO | 9530905 | 11/1995 |

*Primary Examiner*—Patrick Ryan
*Assistant Examiner*—Thomas H. Parsons
(74) *Attorney, Agent, or Firm*—Greenblum & Bernstein, P.L.C.

(57) ABSTRACT

A battery pack system is composed of a plurality of battery pack blocks, each of which is constituted by connecting a plurality of cells in series, that are connected with one another by a combination of serial connection and parallel connection. The battery pack blocks are each provided with a current sensor for detecting current values. Detection results are inputted to a control section, which processes the detected current values using an algorithm constructed in accordance with the connection status of the battery pack blocks. Thereby, an abnormality of the battery pack block is detected, and an abnormal battery pack block is identified.

4 Claims, 4 Drawing Sheets

METHOD AND APPARATUS FOR DETECTING ABNORMALITY IN BATTERY PACK SYSTEM

The present disclosure relates to subject matter contained in priority Japanese Patent Application No. 2001-340661, filed on Nov. 6, 2001, the contents of which is herein expressly incorporated by reference in its entirety.

BACKGROUND OF THE INVENTION

1. Field of the Invention

The present invention relates to a method and an apparatus for detecting an abnormality in a battery pack system. The battery pack system is composed of a plurality of battery pack blocks, each of which is constituted by connecting a plurality of cells in series, that are connected with one another by a combination of serial connection and parallel connection.

2. Description of Related Art

A conventional battery pack system typically incorporates a battery pack block constructed by connecting a plurality of cells in series. For example, six cells are connected together in series so as to provide a battery module, and 20 to 30 units of such battery modules are juxtaposed and connected together in series, whereupon the battery pack block is realized. In the battery pack system, the temperature, voltage, and current of the battery pack block are detected based on output signals from various sensors (not shown) mounted on the battery pack block. Based on the detection results, various control operations and abnormality detection are executed.

Moreover, in keeping with the demand for a higher-capacity, higher-power battery pack system, a battery pack system 100 as shown in FIG. 4 has been proposed that is composed of a plurality of the above-described battery pack blocks 11 connected with one another by a combination of serial connection and parallel connection. In such a battery pack system, a single current sensor 12 is typically disposed in a region where total current flows.

However, the battery pack system shown in FIG. 4 poses the following problem. When an abnormality occurs, e.g., when a rise in battery resistance occurs in the cell incorporated into any of the battery pack blocks 11, the result appears only partly in the current sensor 12. This makes accurate abnormality detection difficult. Even if the abnormality can be detected, it is impossible to immediately determine which one of the battery pack blocks 11 suffers from the abnormality. Thus, appropriate measures cannot be readily taken.

SUMMARY OF THE INVENTION

The present invention has been devised in light of the above-mentioned problems of the conventional art, and accordingly an object of the present invention is to provide a method and an apparatus for detecting an abnormality in a battery pack system. The method and apparatus should also be capable, when an abnormality occurs in any of battery pack blocks constituting a battery pack system, of identifying the abnormal battery pack block.

To achieve the above object, according to one aspect of the present invention, there is provided a method for detecting an abnormality in a battery pack system, the battery pack system being composed of a plurality of battery pack blocks, each of which is constituted by connecting a plurality of cells in series, that are connected with one another by a combination of serial connection and parallel connection. The method includes: detecting a current value of each of the battery pack blocks; and detecting an abnormality occurring in the battery pack block based on a detected current value, by using an algorithm constructed in accordance with a connection status of the battery pack blocks. With this method, an abnormal battery pack block can be identified, depending on the algorithm.

That is, in a battery pack system composed of a plurality of battery pack block groups connected in parallel, each of which is constituted by connecting in series a plurality of battery pack blocks, when a current value difference among the battery pack block groups in a parallel configuration exceeds a predetermined threshold value, it is judged that an abnormality occurs in the battery pack block or in a current detecting member. On the other hand, when a current value difference among the battery pack blocks connected in series exceeds a predetermined threshold value, it is judged that an abnormality occurs in the current detecting member. Based on the judgment, it is possible to make a distinction between a battery pack block abnormality and a current detecting member abnormality.

In a battery pack system composed of a plurality of battery pack block groups connected in series, each of which is constituted by connecting in parallel a plurality of battery pack blocks, when a current value difference among the battery pack blocks in a parallel configuration exceeds a predetermined threshold value, it is judged that an abnormality occurs in the battery pack block or in the current detecting member. On the other hand, when a current value difference among the battery pack block groups in a serial configuration exceeds a predetermined threshold value, it is judged that an abnormality occurs in the battery pack block or in the current detecting member. Moreover, among the battery pack block groups, comparison is made as to the sum of current values in the battery pack blocks connected in parallel. Then, when a difference in the sum of battery pack block's current values among the battery pack block groups exceeds a predetermined threshold value, it is judged that an abnormality occurs in the current detecting member. Based on the judgment, it is possible to make a distinction between a battery pack block abnormality and a current detecting member abnormality.

According to another aspect of the invention, there is provided an apparatus for detecting an abnormality in a battery pack system, the battery pack system being composed of a plurality of battery pack blocks, each of which is constituted by connecting a plurality of cells in series, that are connected with one another by a combination of serial connection and parallel connection. The apparatus includes: a current detecting member disposed in each of the battery pack block, for detecting a current value of the battery pack block; and a control section for identifying an abnormal battery pack block based on a detected current value, by using an algorithm constructed in accordance with a connection status of the battery pack blocks.

While novel features of the invention are set forth in the preceding, the invention, both as to organization and content, can be further understood and appreciated, along with other objects and features thereof, from the following detailed description and examples when taken in conjunction with the attached drawings.

DETAILED DESCRIPTION OF THE PREFERRED EMBODIMENTS

Hereinafter, with reference to FIGS. 1 through 2B, a description will be given as to one embodiment of the method and apparatus for detecting an abnormality in a battery pack system according to the present invention.

Figure 1:
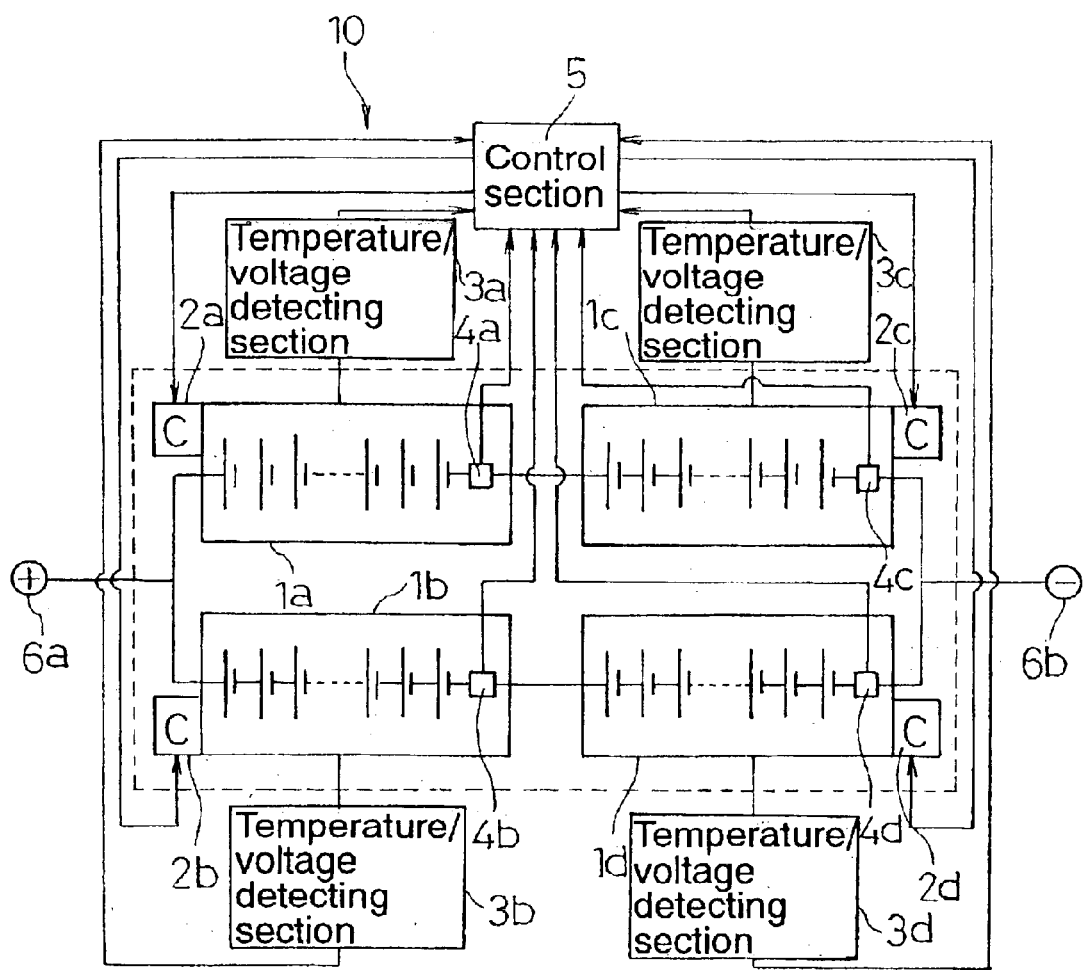
FIG. 1 is a block diagram schematically showing the structure of a battery pack system according to one embodiment of the present invention.

In FIG. 1, reference numeral 10 represents a battery pack system. The battery pack system 10 includes four battery pack blocks 1a to 1d, each of which is constituted by connecting a plurality of cells in series. The battery pack blocks 1a and 1c, as well as 1b and 1d, are connected in series, thereby constituting two battery pack block groups. These battery pack block groups are connected in parallel, whereupon the battery pack system 10 is realized. The battery pack blocks 1a to 1d are each constructed as follows. For example, six cells are connected together in series so as to provide a battery module, and 20 to 30 units of such battery modules are disposed in parallel and connected in series. The battery pack blocks 1a to 1d are provided with cooling fans 2a to 2d, respectively, for cooling purposes.

In correspondence with the battery pack blocks 1a to 1d, there are provided temperature/voltage detecting sections 3a to 3d for detecting the temperature and voltage of each of the battery pack blocks 1a to 1d, based on output signals from a sensor (not shown) attached to each battery pack block. Detection results provided by the temperature/voltage detecting sections 3a to 3d are inputted to a control section 5. Moreover, the battery pack blocks 1a to 1d are provided with current sensors 4a to 4d, respectively, for detecting currents flowing therethrough. Detection results provided by the current sensors 4a to 4d are also inputted to the control section 5.

The control section 5 is designed to control the operation of each of the cooling fans 2a to 2d, in accordance with the detection results provided by the temperature/voltage detecting sections 3a to 3d and the current sensors 4a to 4d. The control section 5 also serves to detect abnormalities occurring in the battery pack blocks 1a to 1d. Reference symbols 6a and 6b each represent an output terminal of the battery pack system 10.

Next, with reference to FIGS. 2A and 2B, a description will be given as to abnormality detection operations that are performed in the battery pack blocks 1a to 1d under the control of the control section 5.

Figure 2A:
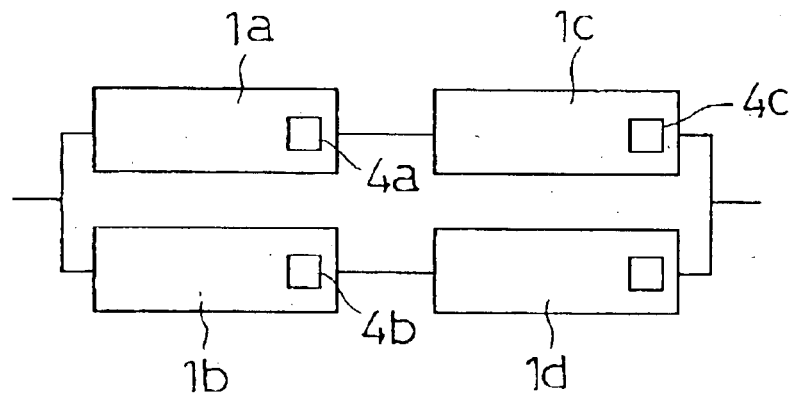
FIGS. 2A and 2B are explanatory diagrams of the workings of the embodiment, with FIG. 2A showing the configuration of a current sensor, and FIG. 2B showing a flow chart of algorithms for use in abnormality detection.
Figure 2B:
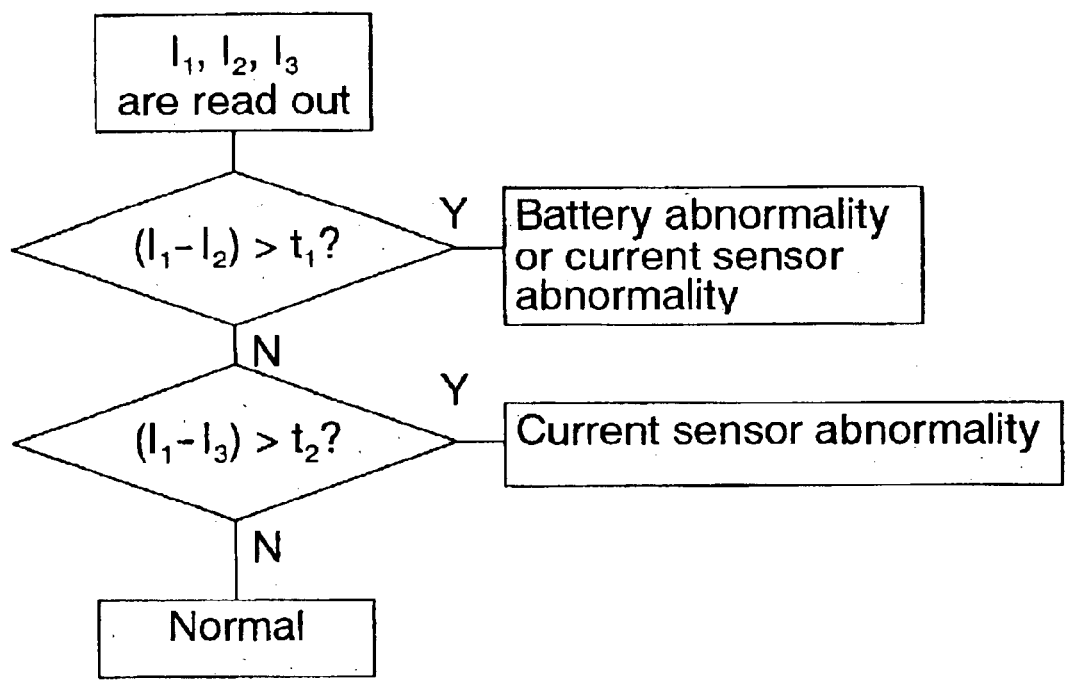

In FIG. 2A, taken up as an explanatory example is a combination of the battery pack blocks 1a, 1b, and 1c, and their current sensors 4a, 4b, and 4c. Here, the currents detected by the current sensors 4a, 4b, and 4c are assumed to be $I_1$, $I_2$, and $I_3$, respectively.

Abnormality detection algorithms adopted in that case will be described below with reference to a flow chart shown in FIG. 2B. Firstly, the currents $I_1$, $I_2$, and $I_3$ detected by the current sensors 4a, 4b, and 4c are read out. Then, whether or not a value $(I_1-I_2)$ exceeds a predetermined threshold value $t_1$ is determined. In normal cases, there is little difference between $I_1$ and $I_2$. Consequently, in a case where $(I_1-I_2)>t_1$, it is judged that a battery abnormality occurs in the battery pack block 1a or 1b, or that an abnormality occurs in the current sensor 4a or 4b. Subsequently, whether or not a value $(I_1-I_3)$ exceeds a predetermined threshold value $t_2$ is determined. In normal cases, values $I_1$ and $I_3$ are identical. Consequently, in a case where $(I_1-I_3)>t_2$, it is judged that an abnormality occurs in any or both of the current sensors 4a and 4c.

Thus, in cases where $(I_1-I_2) \leq t_1$ and $(I_1-I_3) \leq t_2$, it is judged that no abnormality takes place. Moreover, in terms of $(I_1-I_3) \leq t_2$, in a case where $(I_1-I_2)>t_1$ in spite of the fact that the current sensor 4a is kept in a normal state, it is judged that an abnormality occurs in the battery pack block 1a or in the current sensor 4b.

Likewise, a combination of the current sensors 4a, 4b, and 4d, that of the current sensors 4a, 4c, and 4d, and that of the current sensors 4b, 4c, and 4d are each subjected to the algorithm-based judgment. Eventually, it is possible to determine which one of the battery pack blocks 1a to 1d, or which one of the current sensors 4a, 4b, 4c, and 4d suffers from an abnormality. Note that, in some cases, proper determination can be made without performing the algorithm-based judgment on a combination-by-combination basis. Proper determination can also be made by examining the actual value of the current value I.

Figure 3A:
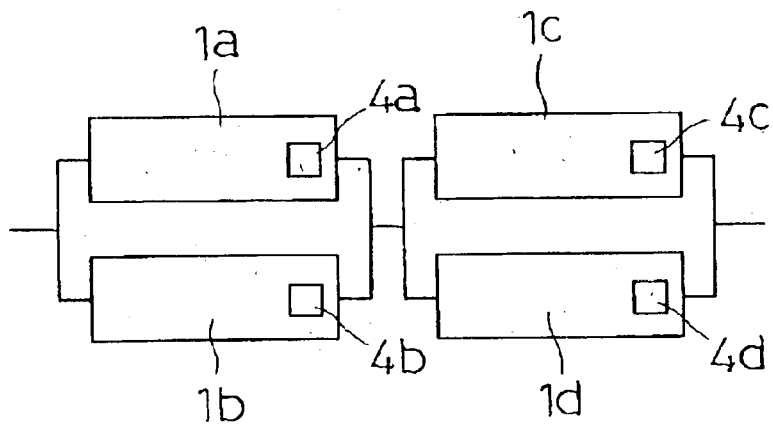
FIGS. 3A and 3B are explanatory diagrams of the workings of another embodiment of the invention, with FIG. 3A showing the configuration of a current sensor, and FIG. 3B showing a flow chart of algorithms for use in abnormality detection.
Figure 3B:
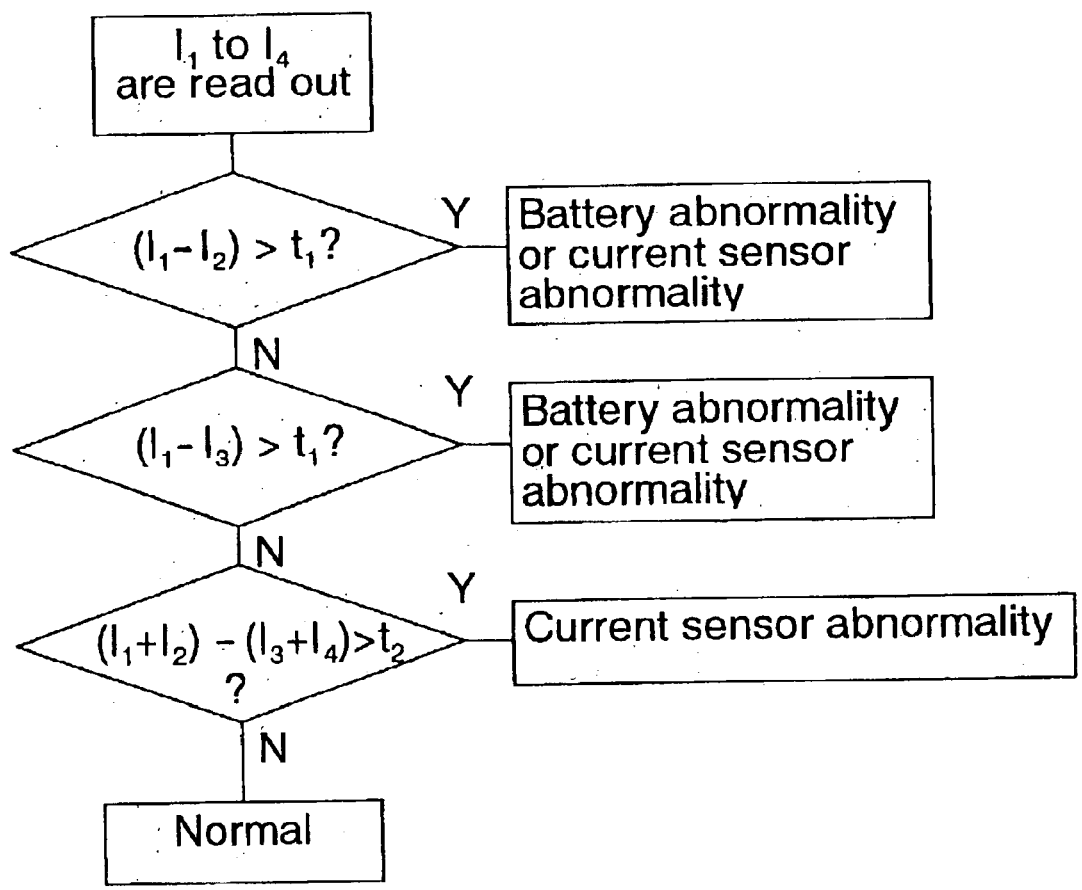
Figure 4:
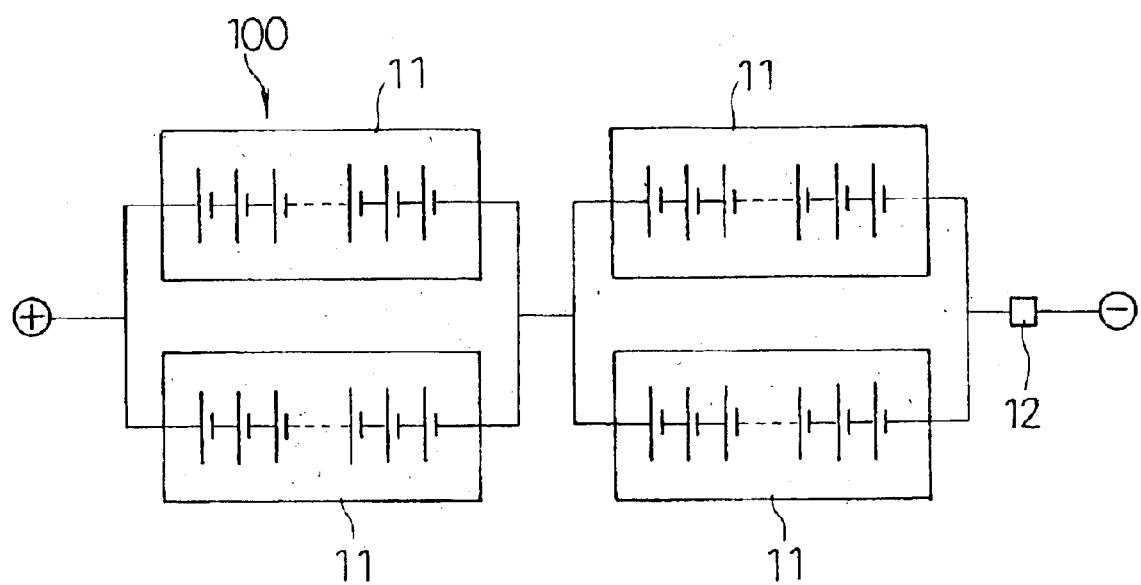
FIG. 4 is a block diagram schematically showing the structure of a conventional battery pack system.

Next, with reference to FIGS. 3A and 3B, a description will be given as to abnormality detection operations that are performed in the battery pack blocks 1a to 1d constituting the battery pack system 10 according to another embodiment of the invention.

The battery pack system 10 of this embodiment is constructed as follows. As shown in FIG. 3A, the battery pack blocks 1a and 1b, as well as 1c and 1d, are connected in parallel, thereby constituting two battery pack block groups. These battery pack block groups are connected in series. Here, the currents detected by the current sensors 4a, 4b, 4c, and 4d of the battery pack blocks 1a to 1d are assumed to be $I_1$, $I_2$, $I_3$, and $I_4$, respectively.

Abnormality detection algorithms adopted in that case will be described below with reference to a flow chart shown in FIG. 3B. Firstly, the currents $I_1$, $I_2$, $I_3$, and $I_4$ detected by the current sensors 4a, 4b, 4c, and 4d are read out. Then, whether or not a value $(I_1-I_2)$ exceeds a predetermined threshold value $t_1$ is determined. In normal cases, there is little difference between $I_1$ and $I_2$. Consequently, in a case where $(I_1-I_2)>t_1$, it is judged that a battery abnormality occurs in the battery pack block 1a or 1b, or that an abnormality occurs in the current sensor 4a or 4b. Subsequently, whether or not a value $(I_1-I_3)$ exceeds the predetermined threshold value $t_1$ is determined. In normal cases, there is little difference between $I_1$ and $I_3$. Consequently, in a case where $(I_1-I_3)>t_1$, it is judged that a battery abnormality occurs in the battery pack block 1a or 1c, or that an abnormality occurs in the current sensor 4a or 4c, provided that the battery pack blocks 1b and 1d are each kept in a normal state. Thereafter, whether or not a value $(I_1+I_2)-(I_3+I_4)$ exceeds a predetermined threshold value $t_2$ is determined. In normal cases, values $(I_1+I_2)$ and $(I_3+I_4)$ are identical. Consequently, in a case where $(I_1+I_2)-(I_3+I_4)>t_2$, it is judged that an abnormality occurs in any of the current sensors 4a to 4d.

Thus, in cases where $(I_1-I_2) \leq t_1$, $(I_1-I_3) \leq t_1$, and $(I_1+I_2)-(I_3+I_4) \leq t_2$, it is judged that no abnormality takes place.

Moreover, in terms of $(I_1+I_2)-(I_3+I_4) \leq t_2$, in cases where $(I_1-I_2)>t_1$, and $(I_1-I_3)>t_1$ in spite of the fact that the current sensors 4a to 4d are each kept in a normal state, it is judged that an abnormality occurs in the battery pack block 1a. On the other hand, in cases where $(I_1-I_2)>t_1$, and $(I_1-I_3) \leq t_1$, it is judged that an abnormality occurs in the battery pack block 1b.

Likewise, a judgment on whether or not $(I_2-I_1)>t_1$ and $(I_2-I_4)>t_1$, a judgment on whether or not $(I_3-I_4)>t_1$ and $(I_3-I_1)>t_1$, and a judgment on whether or not $(I_4-I_3)>t_1$ and $(I_4-I_2)>t_1$ are made successively. Then, by examining combinations of the judgment results, it is possible to determine which one of the battery pack blocks suffers from an abnormality.

As described heretofore, according to the method and apparatus for detecting an abnormality in a battery pack system embodying the present invention, the current value of each of the battery pack blocks is detected, and, based on the detected current values, the abnormality of the battery pack block is detected by using an algorithm constructed in accordance with the connection status of the battery pack blocks. Hence, an abnormal battery pack block is identified successfully by current detection.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A method for detecting an abnormality in a battery pack system, the battery pack system being composed of a plurality of battery pack blocks connected with one another by a combination of serial connection and parallel connection, each of the battery pack blocks being constituted by connecting a plurality of cells in series, the method comprising:

detecting a current value of each of the battery pack blocks; and detecting an abnormality occurring in the battery pack block based on a detected current value, by using an algorithm constructed in accordance with a connection status of the battery pack blocks.

2. The method for detecting an abnormality in a battery pack system according to claim 1, wherein, in the battery pack system composed of a plurality of battery pack block groups connected in parallel, each of the battery pack block groups being constituted by connecting the plurality of battery pack blocks in series, when a current value difference among the battery pack block groups connected in parallel exceeds a predetermined first threshold value, it is judged that an abnormality occurs in the battery pack block or in a current detecting member, and, when a current value difference among the battery pack blocks connected in series exceeds a predetermined second threshold value, it is judged that an abnormality occurs in the current detecting member, and based on the judgment results, determination is made as to the abnormality of the battery pack block.

3. The method for detecting an abnormality in a battery pack system according to claim 1, wherein, in the battery pack system composed of a plurality of battery pack block groups connected in series, each of the battery pack block groups being constituted by connecting the plurality of battery pack blocks in parallel, when a current value difference among the battery pack blocks connected in parallel exceeds a predetermined first threshold value, it is judged that an abnormality occurs in the battery pack block or in a current detecting member, and, when a current value difference among the battery pack block groups connected in series exceeds the first threshold value, it is judged that an abnormality occurs in the battery pack block or in the current detecting member, among the battery pack block groups, comparison is made as to the sum of current values in the battery pack blocks connected in parallel, and, when a difference in the sum of battery pack block's current values among the battery pack block groups exceeds a predetermined second threshold value, it is judged that an abnormality occurs in the current detecting member, and based on the judgment results, determination is made as to the abnormality of the battery pack block.

4. An apparatus for detecting an abnormality in a battery pack system, the battery pack system being composed of a plurality of battery pack blocks connected with one another by a combination of serial connection and parallel connection, each of the battery pack blocks being constituted by connecting a plurality of cells in series, the apparatus comprising:

a current detecting member disposed in each of the battery pack blocks, for detecting a current value of the battery pack block; and a control section for detecting an abnormality of the battery pack block based on a detected current value, by using an algorithm constructed in accordance with a connection status of the battery pack blocks.

* * * * *